SEMICONDUCTOR

Filed April 21, 1965

Inventor:
Hans-Jürgen Schütze
Klaus Hennings
By: Spencer & Kaye
Attorneys

SEMICONDUCTOR

Filed April 21, 1965

Inventors:
Hans-Jürgen Schütze
Klaus Hennings
By: Spencer & Kaye
Attorneys

United States Patent Office 3,427,708
Patented Feb. 18, 1969

3,427,708
SEMICONDUCTOR

Hans-Jürgen Schütze and Klaus Hennings, Ulm (Danube), Germany, assignors to Telefunken Patentverwertungs-gesellschaft m.b.H., Ulm (Danube), Germany Filed Apr. 21, 1965, Ser. No. 449,707
Claims priority, application Germany, Apr. 25, 1964, T 26,075
U.S. Cl. 29—580 2 Claims
Int. Cl. H01l 5/00, 7/02

ABSTRACT OF THE DISCLOSURE

A method for contacting, without forming a depletion layer, a semiconductor body in one side of which one or more circuit elements, such as transistors or diodes, have been formed, the body initially having a certain minimum thickness to provide sufficient structural strength for forming the circuit elements, the process being carried out by etching one recess in the other side of the body opposite each circuit element, each recess extending to a point close to its respective circuit element, applying a metallic layer having a flat outer surface over substantially the entire base of each recess, and dividing the body into separated circuit elements each having a flat surface on the side opposite that in which the circuit element is disposed. A circuit element produced according to the above process and having its associated recess completely filled with a solder mass.

The present invention relates to a method of making semiconductor elements, and, more particularly, to a method for contacting, without forming a depletion layer, a semiconductor body containing one or more circuit elements, in such manner as to decrease the series bulk resistance of the semiconductor body. A low series bulk resistance is desired for all semiconductor circuit elements, be they transistors, diodes, or capacitors, since the higher the series bulk resistance, the greater the voltage drop in the bulk, which increases the saturation voltage and decreases the power gain.

Conventionally, the series bulk resistance in a semiconductor body can be decreased by diffusing or alloying a low-resistivity layer into the semiconductor crystal. It is also known to use epitaxially grown material, specifically a high-resistivity layer bonded to a layer of lower resistivity, to produce such semiconductor elements having a low series bulk resistance. It is relatively difficult to produce layers of semiconductor material having a sufficiently low resistivity by means of diffusion or alloying processes, since there are inherent limits to the amount of doping material which will dissolve in these processes. Moreover, the resistivity of a layer produced by diffusion increases as the distance from the surface of the layer increases. Use of an alloying process increases the incidence of defects in the crystal structure, which is undesirable. With respect to epitaxially grown crystals the use of very low resistivity crystals (e.g., below $10^{-3}$ ohm-centimeters) as starting materials for the growth of additional layers by vapor deposition does not usually produce epitaxial layers of as high a quality crystals as is required. This is because in a highly doped crystal, such as would be used for the starting material, the number of defects is high, and this defect density in part determines the defect density in the lattice of the layer which is deposited on it.

It is therefore an object of the present invention to provide a method for contacting a semiconductor device so that the series bulk resistance is kept low.

It is a further object of the present invention to provide a semiconductor element having a low series bulk resistance.

It is still a further object of the invention to provide an ohmic contact for a semiconductor circuit element without forming a depletion layer, and which results in a device having low series bulk resistance.

These objects as well as others are achieved according to the present invention in a method for contacting, without forming a depletion layer, a semiconductor body in which one or more circuit elements, such as transistors and diodes, have been formed, said body having at least a cetrain minimum thickness to provide sufficient structural strength for forming the circuit elements therein. The method includes the steps of etching a recess into the semiconductor body corresponding to each of the circuit elements, each recess extending to a point close to its respective circuit element where such body is to be contacted, and then forming an electrical contact for each body in its associated recess. The invention also relates to a semiconductor device which is so constructed.

Additional objects and advantages of the present invention will become apparent upon consideration of the following description when taken in conjunction with the accompanying drawings in which.

Figure 1:
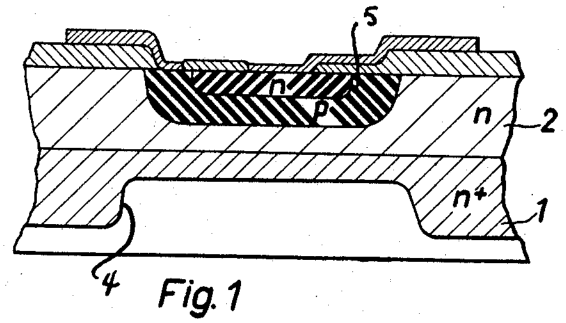
FIGURE 1 is a cross-sectional view of a transistor at a point in the manufacturing process of the present invention.

Referring to the figures shown in the drawings, FIGURE 1 shows a low resistivity $n^+$ substrate 1 upon which a higher resistivity n substrate 2 has been provided, for instance, by epitaxial deposition from a vapor phase. A circuit element 5 which in the present example is a planar transistor, is formed in a conventional manner in the n layer 2. A recess 4 is etched out of the semiconductor body on the collector side, and a contact is provided for the semiconductor body within this recess, such as by filling it with a metallic conductive material.

The process of etching out the recesses may, for example, be carried out after the transistor bodies 5 have been formed in the crystal, by means of conventional photo-resist techniques, using an oxide mask and an etching medium such as chlorine gas. It is advantageous if this etching process is carried out on a plurality of circuit elements, at a stage when they are still joined together in a common semiconductor crystal slab, as illusstrated in FIGURE 2. The slab there illustrated includes a low resistivity layer 1 and a higher resistivity layer 2 upon which an oxide layer 3 has been formed. Windows 8 are etched out of the oxide layer 3 and the semiconductor elements may be diffused into the layer 2 through these windows, so that the oxide layer serves as a mask for the diffusion process. Recesses 4 are etched into the opposite side of the semiconductor body, the area of each recess being greater than the corresponding area of the element diffused into the other side of the crystal sheet. The semiconductor sheet is then cut or broken into individual elements along the lines 6, and the intermediate portions containing the ridges 7 resulting from etching the recesses 4 are disposed of.

Figure 3:
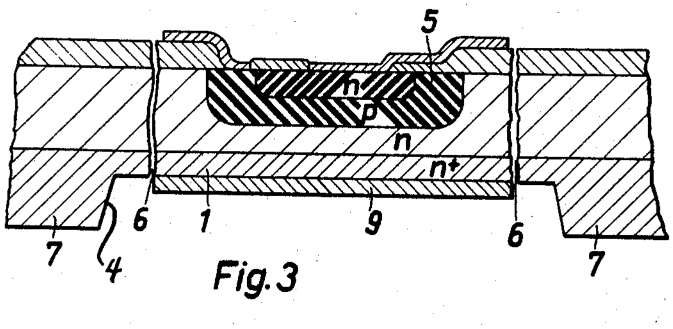
FIGURE 3 is a cross-sectional view of one of the semiconductor elements illustrating its separation from the slab of FIGURE 2.
Figure 2:
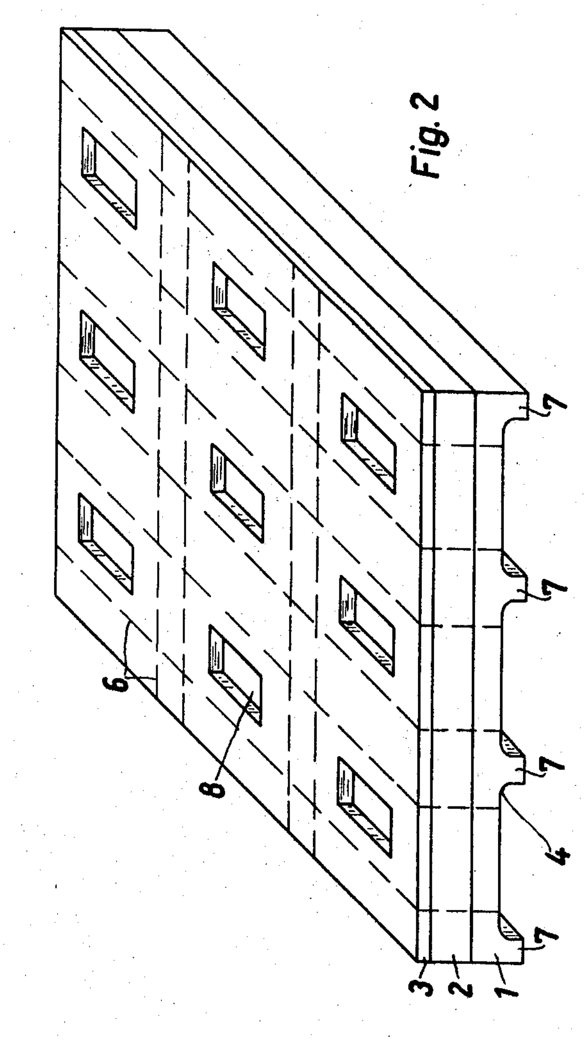
FIGURE 2 is a plan view of a plurality of semiconductor circuit elements formed on a single crystal slab, according to the present invention.

FIGURE 3 shows in detail one of the elements from the sheet of FIGURE 2. The recess 4 which has been etched out of the epitaxial layer 2 should be at least as large as the planar transistor structure 5. Then when the element is broken out of the common sheet, the portion containing the ridges 7 may be discarded. Subsequently, a soldering layer 9 may be provided on the collector side, such as by soldering a gold plated terminal to the element using phosphorous-doped gold foil at a temperature of about 400° C., in an inert gas.

As has thus been seen, according to the present invention, recesses are etched out of the semiconductor slab at points opposite the circuit elements which have been diffused into them from one surface, preferably after such elements have been diffused in. The shape and number of the recesses are determined by the nature of the particular elements provided in the semiconductor body. If several elements are provided on a single semiconductor slab, it is advantageous to etch out a recess corresponding to each individual element. The recess should extend into the semiconductor slab to the point where a contact is desired. Thus, in the case of a transistor formed in an epitaxially grown slab, the major portion of the semiconductor material on the collector slab is etched away. The depression thus formed on the collector side includes a surface opposite the transistor body 5 upon which a contact may be provided. Since a substantial amount of the semiconductor material on the collector side has been etched away, the contact thus provided is closer to the circuit element itself, thus substantially reducing the series bulk resistance. In order to provide such contact, the recess which has been etched out is filled wholly or in part with solder. This solder has a resistivity which is considerably lower—on the order of $10^{-5}$ ohm-centimeters and less—than even the lowest resistivity semiconductor material usable for circuit elements.

As has been shown, with respect to FIGURE 2, the method proposed herein is especially advantageous for producing a number of circuit elements on a single crystal slab, for instance by diffusion on one side of the slab, which slab is afterwards cut or broken up to form the individual circuit elements. Recesses are etched into the side of the crystal slab opposite each of the circuit elements so provided, so that a network of ridges separating the individual recesses is left. The area of each recess should be at least as great as that of the transistor or other circuit element itself. The slab is then cut or broken into individual elements in such a manner that the ridges left from the etch process may be disposed of. This method has the advantage that during the time that the slab is being worked on, it remains reinforced by the ridges, or ribs. Its original thickness is necessary to make it strong enough to undergo the diffusion process whereby the circuit elements are formed in it. When the slab is broken up, the individual elements are very thin; however, they have commensurately small surface area. Thus, the danger of breakage of the elements is low both before and after the slab is divided up, since the ratio between surface area and thickness is at all times low enough to provide adequate structural strength. The individual elements can then be provided on the emitter side (in the case of transistors) with the proper contacts, in the conventional manner.

In order to divide the slab into individual circuit elements, the surface may be scored, forming a network of grooves, as shown, and then broken along the score lines, in the conventional manner. The grooves should form a closed pattern about each circuit element within the region of its respective recess. However, it can also be done by etching grooves into the surface after properly masking it, since only about 10 to 20 microns have to be etched through. This makes it unnecessary to use the more complex and expensive scoring procedure.

The following is a complete illustrative example of the method according to the present invention in case of silicon as semiconductor material and npn-transistors. The procedure starts with a $n/n^+$-silicon epitaxial wafer with a low resistivity substrate in the region of $10^{-3}$ to $10^{-2}\Omega$-cm. and a thickness of about 150–200 microns and an epitaxial layer of higher resisitivity material of about $1\Omega$-cm. and for example 10 microns thick. Circuit elements as planar transistors or diodes are formed in this epitaxial layer in a conventional manner, for example 1225 transistors in 35 horizontal and vertical lines with collector regions of 300 x 300 microns. These wafers usually come out of transistor production before they are cut into single transistor pellets, which then will be bonded to a header.

The backside of this wafer is now masked also in a conventional manner with a photoresist mask and such a pattern that small areas exactly opposite of the collector area and somewhat larger than the collector area, in this example about 380 x 380 microns, remain unprotected. The usual steps are coating the wafer with a photoresist layer, putting on top of this a photomask with a corresponding pattern, aligning this to the transistor structure on the frontside of the wafer, exposing, developing and baking out (about 200° C.) the photoresist. During this process the frontside of the wafer with the transistor-structures incorporated is already coated with photoresist. By exposing this side homogeneously, the transistors are protected against the following etch process.

The wafers are now etched for example in a 1:2:2 mixture of hydrofluoric, nitric and acetic acid, that produces recesses with a depth of about 80–90 microns in the case of a total wafer thickness of 150 microns. This means an etching time of 15–20 minutes depending on the degree of agitation. Photoresist is removed with a stripper as Trichlorethylen (TCE) and recesses of about 560 x 560 microns in area or a lattice of ridges 180 microns broad are left.

Another photoresist mask is then applied on the frontside, which leaves uncovered a lattice of lines 100 microns wide. This lattice again is aligned to the transistor structure of this side. The backside remains unmasked i.e. unexposed. These lines are etched into the wafer about 40 microns deep in 5–8 minutes, etching a $40\mu$ thick layer from the uncovered backside at the same time. The photoresist mask is removed for example in boiling Trichlorethylen. The pellets are dried and mounted on goldplated headers in a conventional manner at a temperature of about 400° C. If necessary small phosphorus or antimony doped goldfoils are put between pellet and header for better soldering.

The two etch processes may be combined to one by masking the frontside of the wafer with a lattice pattern and the backside with a recess pattern at the same time. In this case, the width of the lattice lines should be only 20–30 microns and the photoresist film on the frontside has to be extremely resistant, for example by double coating.

If the collector contact is made by filling the recess in part with metal, the recesses are etched in the same manner as described before, but only 300 x 300 microns in area and 120–130 microns deep. After cleaning the wafers in TCE and DI-water for example a gold film is deposited on the backside by evaporating techniques in a vacuum chamber with a pressure in the range of some $10^{-6}$ torr, evaporating the gold from a tungsten boot. This film with a thickness of about 1 micron is alloyed at a temperature of 380–400° C. for some seconds and a second gold film is deposited on to the alloyed film with a thickness of 5–10 microns. Both depositions and alloying may be done in the same vacuum chamber, but the second deposition can also be done by electroplating, covering the frontside of the wafer with a wax.

The wafers are than separated into pellets by scribing and breaking in a conventional manner and the pellets bonded to headers as described before.

It will be understood that the above description of the present invention is susceptible to various modifications, changes, and adaptations, and the same are intended to be comprehended within the meaning and range of equivalents of the appended claims.

What is claimed is:

1. A method for contacting, without forming a depletion layer, a semiconductor body in one side of which one or more circuit elements, such as transistors or diodes, have been formed, said body having a certain minimum thickness to provide sufficient structural strength for forming the circuit elements therein, said method comprising the steps of:

etching, into the other side of said body, one recess opposite each said circuit element, each said recess having a substantially flat bottom portion greater in area than its respective element and extending to a point close to its respective circuit element;

applying a metallic contact-forming layer over substantially the entire bottom portion of each said recess;

dividing the body into separate circuit devices each containing a contacted element by severing each device from the body along a line which encompasses the element and at least a portion of its respective metallic layer and which lies entirely within the bottom portion area of the recess; whereby each individual device can be soldered to a support by means of its associated metallic layer.

2. A method as defined in claim 1 wherein said step of applying a layer is carried out by at least partially filling each said recess with a mass of solder.

References Cited

UNITED STATES PATENTS

| | | | |
|---|---|---|---|
| 2,748,041 | 5/1956 | Leverenz | 148—33 |
| 2,981,877 | 4/1961 | Noyce | 317—235 |
| 3,042,565 | 7/1962 | Lehovec | 156—17 |
| 3,046,176 | 7/1962 | Bosenberg | 29—578 X |
| 3,135,638 | 6/1964 | Cheney. | |
| 2,967,344 | 1/1961 | Mueller | 29—578 |

FOREIGN PATENTS

| | | |
|---|---|---|
| 161,714 | 3/1955 | Australia. |

WILLIAM I. BROOKS, *Primary Examiner.*

U.S. Cl. X.R.

29—589; 317—235